US010177676B2

(12) United States Patent
Tokuyama et al.

(10) Patent No.: US 10,177,676 B2
(45) Date of Patent: Jan. 8, 2019

(54) POWER CONVERTER

(71) Applicant: Hitachi Automotive Systems, Ltd., Hitachinaka-shi, Ibaraki (JP)

(72) Inventors: Takeshi Tokuyama, Tokyo (JP); Morio Kuwano, Hitachinaka (JP); Toshiya Satoh, Hitachinaka (JP); Akihiro Namba, Tokyo (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/544,375

(22) PCT Filed: Feb. 26, 2016

(86) PCT No.: PCT/JP2016/055745
§ 371 (c)(1),
(2) Date: Jul. 18, 2017

(87) PCT Pub. No.: WO2016/140153
PCT Pub. Date: Sep. 9, 2016

(65) Prior Publication Data
US 2018/0013355 A1    Jan. 11, 2018

(30) Foreign Application Priority Data
Mar. 5, 2015   (JP) ................................. 2015-043092

(51) Int. Cl.
*H02M 7/00* (2006.01)
*H01L 23/48* (2006.01)
(Continued)

(52) U.S. Cl.
CPC ............ *H02M 7/003* (2013.01); *H01L 23/48* (2013.01); *H01L 25/07* (2013.01); *H01L 25/18* (2013.01);
(Continued)

(58) Field of Classification Search
CPC .............................. H02M 7/003; H02M 7/44
See application file for complete search history.

(56) References Cited

U.S. PATENT DOCUMENTS

| 9,246,408 B2 * | 1/2016 | Maeda .................. H02M 7/003 |
| 2008/0130223 A1 | 6/2008 | Nakamura et al. |
| 2009/0231811 A1 | 9/2009 | Tokuyama et al. |

FOREIGN PATENT DOCUMENTS

| JP | 2005-237141 A | 9/2005 |
| JP | 2008-118753 A | 5/2008 |

(Continued)

OTHER PUBLICATIONS

International Search Report (PCT/ISA/210) issued in PCT Application No. PCT/JP2016/055745 dated May 31, 2016 with English-language translation (three (3) pages).

(Continued)

*Primary Examiner* — Kyle J Moody
(74) *Attorney, Agent, or Firm* — Crowell & Moring LLP

(57) ABSTRACT

An object of the present invention is to reduce wire inductance without damaging manufacturability of a power converter. A power converter according to the present invention includes a power semiconductor module, a capacitor, and DC bus bars and. The capacitor smooths a DC power. The DC bus bars and transmit the DC power. The DC bus bars and include a first terminal and a second terminal. The first terminal connects to the power semiconductor module. The second terminal connects to the capacitor. The DC bus bars and form a module opening portion to insert the power semiconductor module. The DC bus bars and form a closed circuit such that a DC current flowing between the first terminal and the second terminal flows to an outer periphery of the module opening portion.

8 Claims, 14 Drawing Sheets

(51) Int. Cl.
*H01L 25/07* (2006.01)
*H01L 25/18* (2006.01)
*H02M 7/48* (2007.01)
*H05K 7/14* (2006.01)
*H02M 7/44* (2006.01)
*H05K 7/02* (2006.01)

(52) U.S. Cl.
CPC ............... *H02M 7/44* (2013.01); *H02M 7/48* (2013.01); *H05K 7/1432* (2013.01); *H05K 7/02* (2013.01)

(56) References Cited

FOREIGN PATENT DOCUMENTS

| | | |
|---|---|---|
| JP | 2009-219270 A | 9/2009 |
| JP | 2014-103807 A | 6/2014 |
| JP | 2014-171342 A | 9/2014 |
| WO | WO 2014/136335 A1 | 9/2014 |

OTHER PUBLICATIONS

Japanese-language Written Opinion (PCT/ISA/237) issued in PCT Application No. PCT/JP2016/055745 dated May 31, 2016 (three (3) pages).

\* cited by examiner

POWER CONVERTER

TECHNICAL FIELD

The present invention relates to a power converter which converts a DC current into an AC current and especially relates to a power converter which supplies the AC current to a drive motor of a hybrid vehicle and an electric vehicle.

BACKGROUND ART

In recent years, a power converter is required to output a large current and also required to reduce its size. When a power converter outputs a large current, heat generated in a power semiconductor device incorporated in a power semiconductor module is increased. Therefore, if heat capacities of the power semiconductor module and the power converter are not increased, the generated heat reaches a heat resistance temperature of the power semiconductor device, and it hinders the size reduction. A double-sided cooling power semiconductor module which can improve a cooling efficiency by cooling a power semiconductor device from double sides and a double-sided cooling power converter using the double-sided cooling power semiconductor module have been developed.

In the double-sided cooling power semiconductor module, double main surfaces of the power semiconductor device are sandwiched by plate-like conductors. Further, surfaces facing the main surfaces of the power semiconductor device and surfaces of the plate-like conductors on the opposite side are cooled by being thermally connected to a cooling medium, and a main circuit is wired by a bus bar assembly connecting a plurality of the double-sized cooling power semiconductor modules.

A power converter is disclosed in PTL 1. In the power converter, a power module is formed by sandwiching, by plate-like lead frames, double main surfaces of a power semiconductor device included in an arm of an inverter circuit. The power module is inserted into a case storing a plurality of the power modules and fixed by being sandwiched by the case. A main circuit wiring is formed by connecting the power modules by a bus bar integrated into the case by an insulating resin.

On the other hand, in a power converter disclosed in PTL 2, a power module is formed by sandwiching, by plate-like lead frames, double main surfaces of a power semiconductor device included in an arm of an inverter circuit. The power module and a cooling water passage are disposed so as to surround a capacitor module to improve a cooling efficiency of the whole of an inverter main circuit.

CITATION LIST

Patent Literature

PTL 1: JP 2005-237141 A
PTL 2: JP 2009-219270 A

SUMMARY OF INVENTION

Technical Problem

However, in the structure disclosed in PTL 1, a positive electrode side and a negative electrode side of a DC bus bar are mounted away from each other, and a surge voltage and a device loss are increased due to an increase in wire inductance. Further, in the structure disclosed in PTL 2, when a plurality of power modules is connected to a DC bus bar incorporated into a capacitor, a tolerance and a position deviation effect, and manufacturability is lowered.

To realize both of the large current and the size reduction in a power converter, it is necessary to improve a cooling performance of a power semiconductor module and connect a power module, a capacitor, and a bus bar with a low inductance and superior assemblability. Especially, a capacitor to smooth power transmitted from a battery to a power module and a DC bus bar connecting the capacitor are required to reduce the wire inductance and improve assemblability.

An object of the present invention is to reduce wire inductance and improve manufacturability of a power converter.

Solution to Problem

To solve the above issue, a power converter according to the present invention includes a power semiconductor module, a capacitor, and a DC bus bar. The power semiconductor module converts a DC power into an AC power. The capacitor smoothes the DC power. The DC bus bar transmits the DC power. The DC bus bar includes a first terminal and a second terminal. The first terminal connects to the power semiconductor module. The second terminal connects to the capacitor. The DC bus bar forms a module opening portion to insert the power semiconductor module. The DC bus bar forms a closed circuit such that a DC current flowing between the first terminal and the second terminal flows to an outer periphery of the module opening portion.

Advantageous Effects of Invention

Wire inductance can be reduced without damaging manufacturability of a power converter.

DESCRIPTION OF EMBODIMENTS

A power converter according to the present invention will be described below with reference to the drawings.
First Embodiment A power converter according to a first embodiment is applicable to a hybrid vehicle and a pure electric vehicle. An inverter for vehicle driving converts a DC power supplied from an in-vehicle battery included in an in-vehicle power source or an in-vehicle power generator into a predetermined AC power. The obtained AC power is supplied to an electric motor for vehicle driving and controls driving of the electric motor. In addition, the electric motor for vehicle driving has a function as a power generator. Therefore, an inverter for vehicle driving has a function to convert an AC power generated from the electric motor for vehicle driving into a DC power in accordance with an operation mode. A configuration of the embodiment is optimum as a power converter for vehicle driving for such as an automobile and a truck. However, other than the power converter for vehicle driving, the configuration is also applicable to, for example, a power converter for a train, a ship, or an airplane, an industrial power converter used for a control apparatus of an electric motor for driving plant equipment, and a domestic power converter used for a control apparatus of an electric motor for driving a household solar power system and a household electric appliance.

Figure 1:
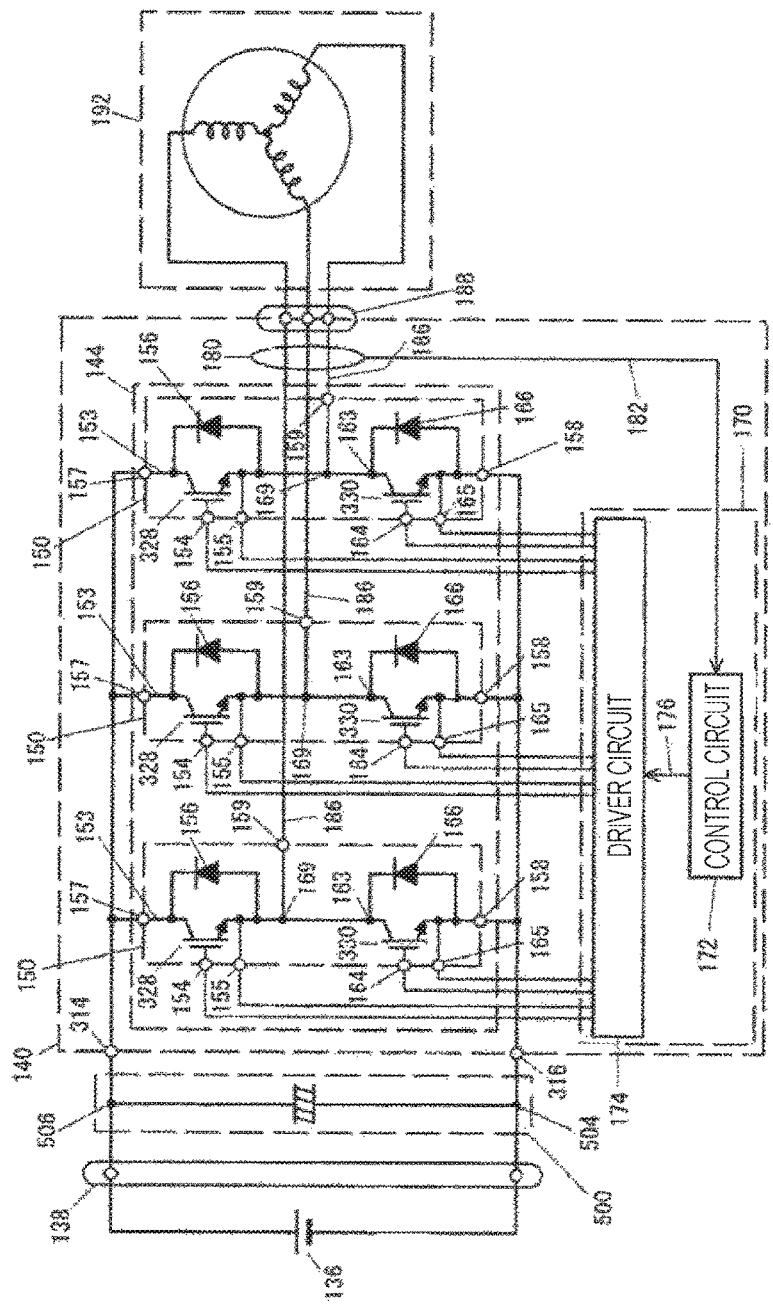
FIG. 1 is an electric circuit diagram of an inverter 140.

A configuration of an electric circuit of the inverter 140 will be described with reference to FIG. 1.

An inverter circuit 144 includes three phase (a U phase, a V phase, and a W phase) upper/lower arm series circuits 150 corresponding to phase windings of an armature winding of a motor generator 192. The upper/lower arm series circuit includes an IGBT 328 and a diode 156 which operate as an upper arm and an IGBT 330 and a diode 166 which operate as a lower arm. Each upper/lower arm series circuit 150 is connected to an AC power line (AC bus bar) 186 connecting from an intermediate portion (intermediate electrode 169) to the motor generator 192 through an AC terminal 159 and an AC connector 188.

A collector electrode 153 of the IGBT 328 of the upper arm is electrically connected to a positive electrode side capacitor electrode of a capacitor module 500 via a positive electrode terminal (P terminal) 157. An emitter electrode of the IGBT 330 of the lower arm is electrically connected to a negative electrode side capacitor electrode of the capacitor module 500 via a negative electrode terminal (N terminal) 158.

The IGBT 328 includes a collector electrode 153, a gate electrode 154, and an emitter electrode 155 for a signal. Further, the IGBT 330 includes a collector electrode 163, a gate electrode 164, an emitter electrode 165 for a signal. The diode 156 is electrically connected in parallel with the IGBT 328. Further, the diode 166 is electrically connected in parallel with the IGBT 330. A metal-oxide-semiconductor field-effect transistor (MOSFET) may be used as a switching power semiconductor device. In this case, the diode 156 and the diode 166 are not needed. The capacitor module 500 is electrically connected to a positive electrode side capacitor terminal 506 and a negative electrode side capacitor terminal 504 via a DC connector 138. The inverter 140 is connected to the positive electrode side capacitor terminal 506 via a DC positive electrode terminal 314 and also connected to the negative electrode side capacitor terminal 504 via a DC negative terminal 316.

The gate electrode 154 and the emitter electrode 155 for a signal in FIG. 1 correspond to a signal connection terminal 327U illustrated in FIG. 3 to be described later. The gate electrode 164 and the emitter electrode 165 in FIG. 1 correspond to a signal connection terminal 327L illustrated in FIG. 3. The positive electrode terminal 157 illustrated in FIG. 1 is same as a positive electrode side terminal 315D illustrated in FIG. 3. The negative electrode terminal 158 illustrated in FIG. 1 is same as a negative electrode side terminal 319D illustrated in FIG. 3. The AC terminal 159 illustrated in FIG. 1 is same as an Ac terminal 320D illustrated in FIG. 3.

A first embodiment of a double-sided cooling power converter 299 according to the embodiment will be described with reference to FIGS. 2 and 3.

Figure 2A:
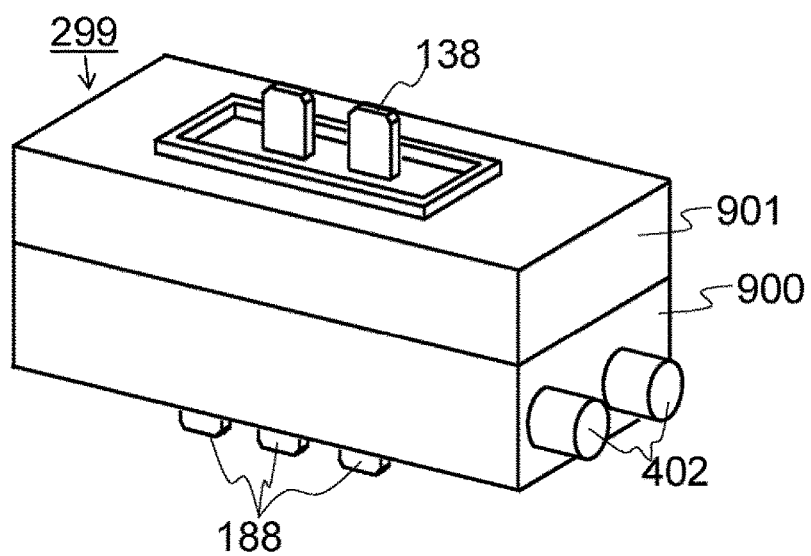
FIG. 2A is an external perspective view of a power converter according to a first embodiment.

FIG. 2(a) is a perspective view indicating an appearance of the power converter 299 The power converter 299 includes the DC connector 138 to electrically connect to a battery 136 and an AC connector 188 to electrically connect to the motor generator 192. Further, parts included in the power converter 299 are stored in a case lid 901 of a case 900. The DC connector 138 is provided to the case lid 901, and the AC connector 188 is provided to the case 900. Further, the case 900 includes a refrigerant inlet/outlet 402 to introduce and derive a cooling medium such as cooling water into and from the case.

Figure 2B:
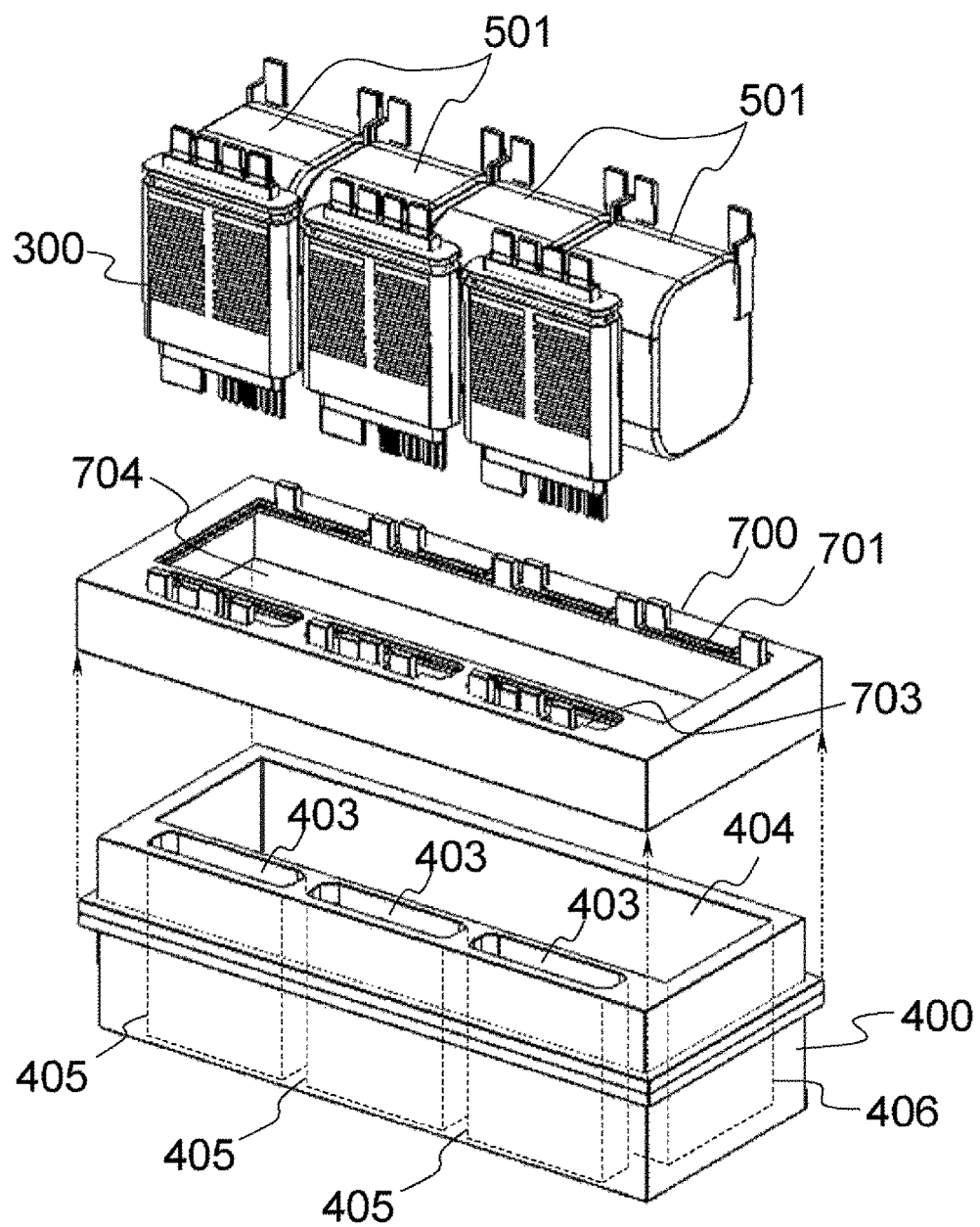
FIG. 2B is an exploded perspective view of the power converter according to the first example.

FIG. 2(b) is an exploded perspective view indicating a process to assemble the power converter 299. In FIG. 2(b), for convenience of description, parts such as a control board and a signal connector are not illustrated, and only main parts are illustrated.

The power converter 299 includes a passage forming body 400 in which a cooling passage is integrated, a DC positive electrode bus bar 700, a DC negative electrode bus bar 701, a power semiconductor module 300, and a capacitor cell 501. Here, the power semiconductor module 300 is modularized such that the DC circuit 150 illustrated in FIG. 1 is set as one unit as described later with reference to FIG. 3. In addition, the capacitor cell 501 is included in the capacitor module 500 illustrated in FIG. 1. In the embodiment, three power semiconductor modules 300 and four capacitor cells 501 are disposed.

The passage forming body 400 includes a module opening 403 in which the power semiconductor module 300 is inserted and a capacitor opening 404 in which the capacitor cell 501 is inserted. One module opening 403 is provided to one power semiconductor module 300. One capacitor opening 404 is provided with respect to a plurality of the capacitor cells 501. However, a plurality of capacitor openings 404 may be provided.

The passage forming body 400 includes a module storage 405 to store the power semiconductor module 300 and a capacitor storage 406 to store the capacitor cell 501. The module opening 403 is connected to the module storage 405. The capacitor opening 404 is connected to the capacitor storage 406. The passage forming body 400 functions as a case including the module storage 405 to store the power semiconductor module 300 and the module opening 403 to connect to the module storage 405. The passage forming body 400 also functions as a case including the module storage to store the power semiconductor module 300 and the module opening 403 to connect to the module storage.

A refrigerant introduced from the refrigerant inlet/outlet 402 flows in the passage forming body 400, and the passage forming body 400 cools the power semiconductor module 300 and the capacitor cell 501 which are inserted into an opening provided in the passage forming body 400.

As described later with reference to FIG. 4, an opening to insert the power semiconductor module 300 and the capacitor cell 501 is formed in the DC positive electrode bus bar 700 and the DC negative electrode bus bar 701 as with the passage forming body 400. The power semiconductor module 300 is inserted from a module opening portion 703. The capacitor cell 501 is inserted from a capacitor opening portion 704.

Figure 2C:
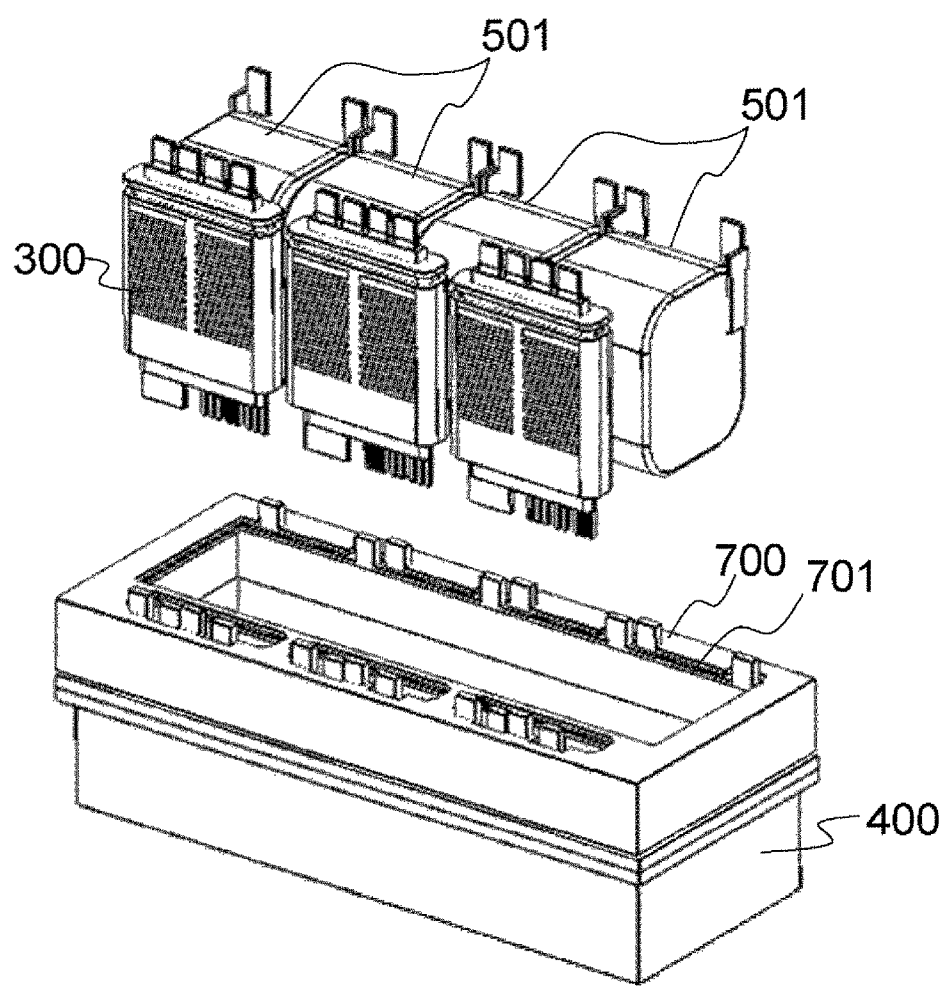
FIG. 2C is a perspective view in a state in which a bus bar is mounted to a passage forming body in comparison with the state illustrated in FIG. 2(*b*).

FIG. 2(c) is a perspective view illustrating a state in which the DC positive electrode bus bar 700 and the DC negative electrode bus bar 701 are mounted in the passage forming body 400 as indicated by a dashed line arrow in FIG. 2(b). As illustrated in FIG. 2(c), the DC positive electrode bus bar 700 and the DC negative electrode bus bar 701 are fixed to the passage forming body 400. At this time, the module opening portions 703 included in the DC positive electrode bus bar 700 and the DC negative electrode bus bar 701 are communicated to the module storage 405 via the module opening 403 of the passage forming body 400. Further, the capacitor opening portions 704 included in the DC positive electrode bus bar 700 and the DC negative electrode bus bar 701 are communicated to the capacitor storage 406 via the capacitor opening 404 of the passage forming body 400.

Further, the passage forming body 400 is formed, for example, by a resin material, and the DC positive electrode bus bar 700 and the DC negative electrode bus bar 701 can be embedded and integrally formed. At this time, since other materials to fix the DC positive electrode bus bar 700 and the DC negative electrode bus bar 701 to the passage forming body 400 is not needed, a number of parts can be reduced. Further, by integrally forming by a thermoconductive material, the DC positive electrode bus bar 700 and the DC negative electrode bus bar 701 can be effectively cooled.

Figure 2D:
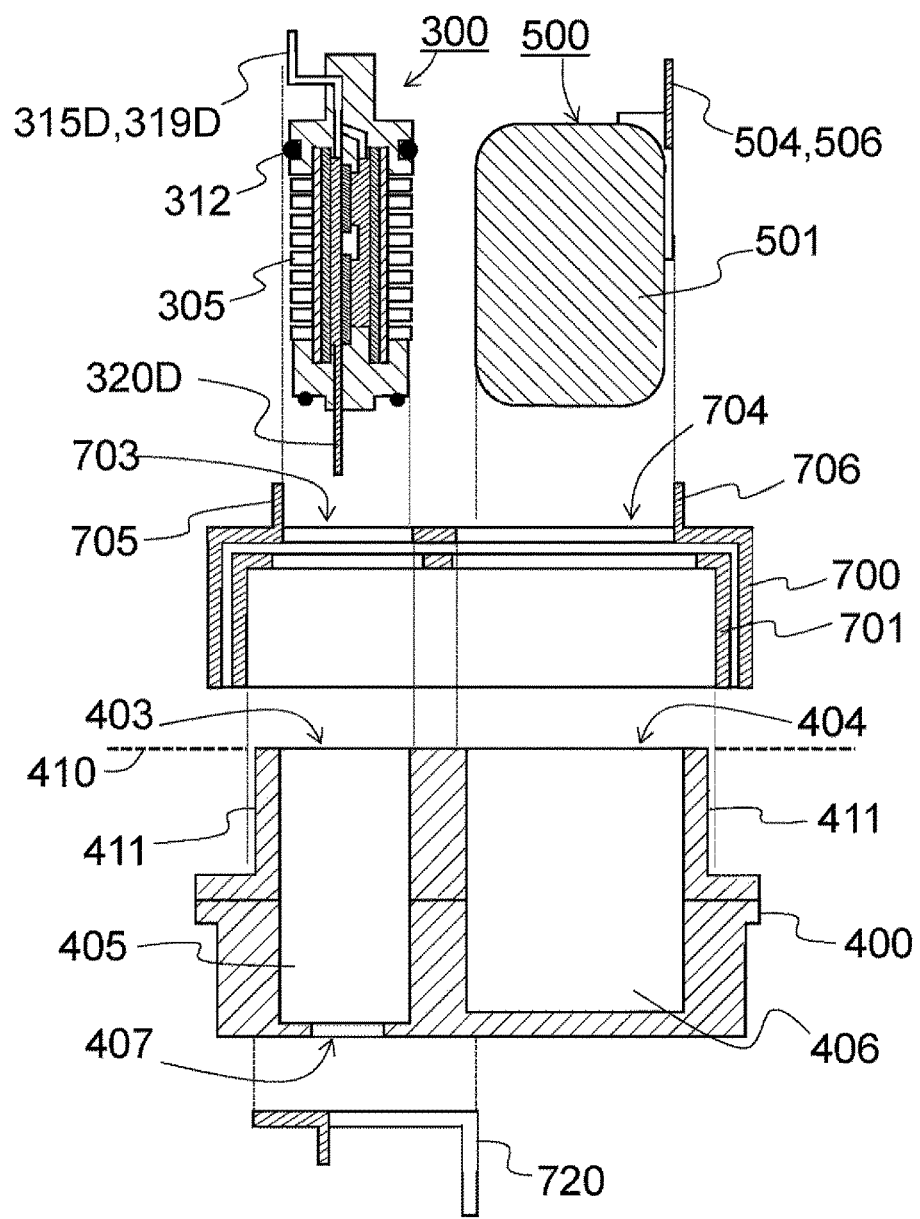
FIG. 2D is an exploded perspective view of the power converter according to the first embodiment.

FIG. 2(d) is an exploded sectional view of the power converter 299 corresponding to the state illustrated in FIG. 2(b). An AC bus bar 720 which is not illustrated in FIG. 2(b) is also illustrated in FIG. 2(d). The AC bus bar 720 is disposed opposed to the DC positive electrode bus bar 70 and the DC negative electrode bus bar 701 across the passage forming body 400. Further, the passage forming body 400 includes a module second opening 407 connecting to the module storage 405. The module second opening 407 is formed opposed to the module opening 403. The AC terminal 320D of the power semiconductor module 300 is connected to the AC bus bar 720 through the module second opening 407.

The module opening 403 and the capacitor opening 404 are formed on one surface of the passage forming body 400. In FIG. 2(d), the module opening 403 and the capacitor opening 404 are formed on an upper surface of the passage forming body 400. Herein, a virtual plane 410 will be defined which is a plane matched with the upper surface of the passage forming body 400 in which the module opening 403 and the capacitor opening 404 are formed. The passage forming body 400 includes a side wall surface 411 connecting to the upper surface matched with the virtual plane 410. The side wall surface 411 is formed opposed to the module storage 405 and the capacitor storage 406.

Figure 2E:
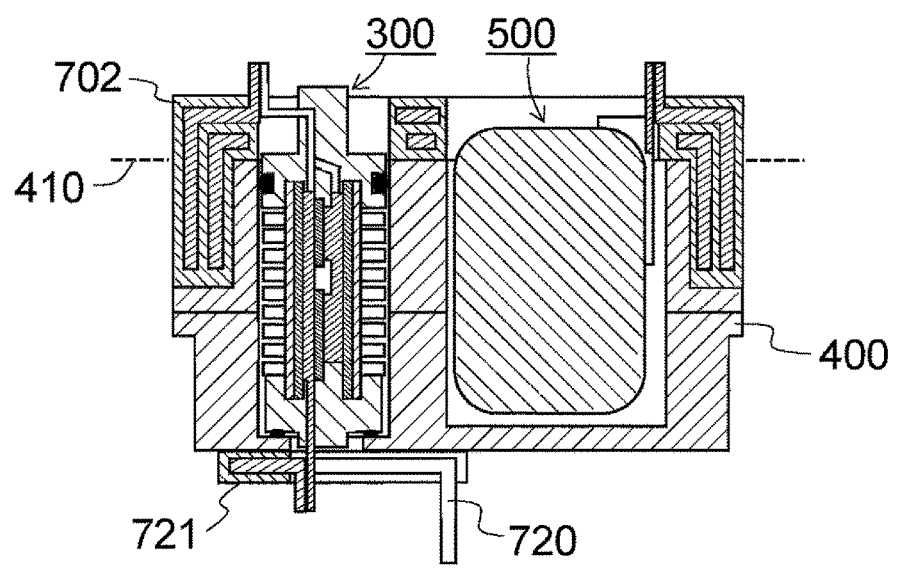
FIG. 2E is an assembly sectional view of the power converter according to the first embodiment.

FIG. 2(e) is a sectional view indicating a state in which the power converter 299 illustrated in FIG. 2(d) is assembled.

Figure 4A:
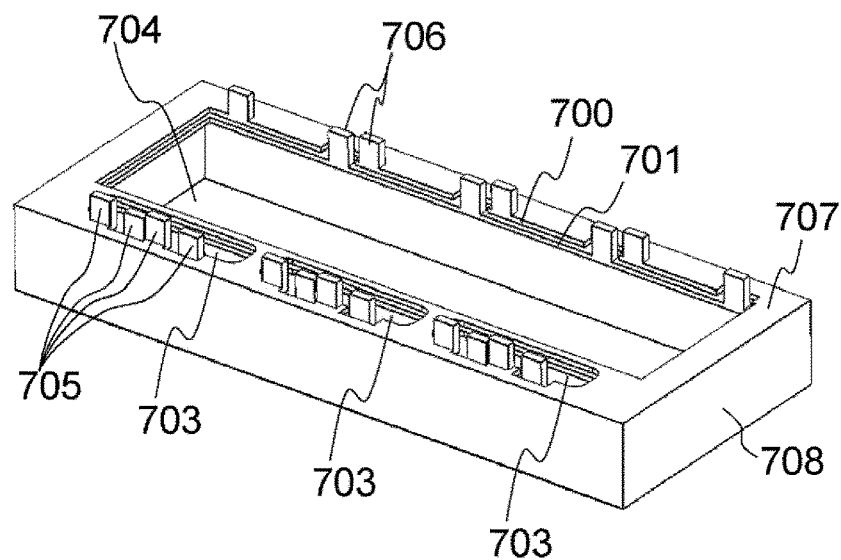
FIG. 4A is an appearance perspective view of a structure of a DC bus bar according to the first embodiment.

The DC positive electrode bus bar 700 and the DC negative electrode bus bar 701 according to the embodiment include a wide plane portion 707 along the virtual plane 410 and an extension portion 708 bending from the plane portion 707 and extending downward (refer to FIG. 4(a)). The extension portion 708 is disposed along the side wall surface 411 of the passage forming body 400 across the virtual plane 410.

Further, the module opening portions 703 formed in the DC positive electrode bus bar 700 and the DC negative electrode bus bar 701 are disposed so as to overlap with the module opening 403 formed on the passage forming body 400. Similarly, the capacitor opening portion 704 is disposed so as to overlap with the capacitor opening 404. As a result, even in a state in which the DC positive electrode bus bar 700 and the DC negative electrode bus bar 701 are attached to the passage forming body 400, the power semiconductor module 300 can be stored in the module storage 405 via the module opening portion 703. Similarly, the capacitor cell 501 can be stored in the capacitor storage 406 via the capacitor opening portion 704.

Further, a bus bar sealing resin 702 which seals the DC positive electrode bus bar 700 and the DC negative electrode bus bar 701 is illustrated in FIG. 2(e). A bus bar sealing resin 721 which seals the AC bus bar 720 is also illustrated.

The bus bar sealing resin 702 secures insulation between the DC positive electrode bus bar 700 and the DC negative electrode bus bar 701. In the bus bar sealing resin 702, the DC positive electrode bus bar 700 and the DC negative electrode bus bar 701 are integrated.

Further, the bus bar sealing resin 702 can be formed as a member integrated with the passage forming body 400. In this case, it is not necessary to dispose a member for heat dissipation or a member for fixing between the bus bar sealing resin 702 and the passage forming body 400. Therefore, heat in the DC positive electrode bus bar 700 and the DC negative electrode bus bar 701 can be efficiently transmitted to a refrigerant flowing in the passage forming body 400. In addition, by reducing a number of parts, the assemblability can be improved, and costs can be reduced.

Further, as with the bus bar sealing resin 702, the sealing resin 721 which seals an AC bus bar describes the power semiconductor module 300 with reference to FIG. 3.

Figure 3A:
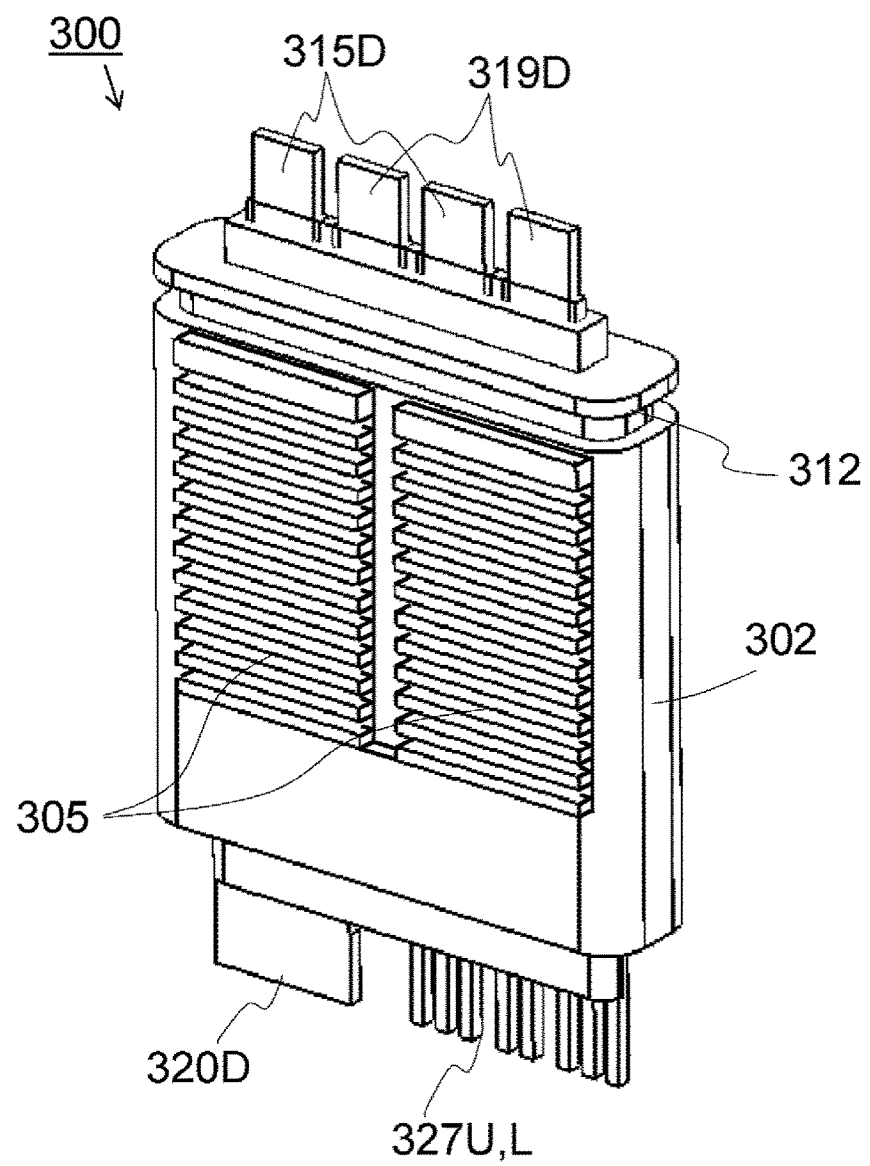
FIG. 3A is an appearance perspective view of the power semiconductor module 300.

FIG. 3(a) is an appearance perspective view of the power semiconductor module 300. The whole of the power semiconductor module 300 is waterproofed by being covered by a waterproof-coated sealing body 302. A plurality of IGBTS and diodes which are a power semiconductor device is incorporated into the power semiconductor module 300. A fin 305 is exposed from the waterproof-coated sealing body 302 and cools the power semiconductor device.

The power semiconductor module 300 is a flat module, and the fins 305 are formed on double main surfaces. The positive electrode side terminal 315D and the negative electrode side terminal 319D which are electrically connected to a power semiconductor device are projected from an upper surface of the power semiconductor module 300. Two each of the positive electrode side terminals 315D and the negative electrode side terminals 319D are disposed. The four terminals are disposed in a row such that each terminal main surface thereof is disposed on the same virtual plane. The positive electrode side terminals 315D and the negative electrode side terminals 319D are alternatively disposed. The AC terminal 320D, the signal connection terminals 327U and 327L are projected from a lower surface of the power semiconductor module 300 which is a surface on a side opposite to a side where the positive electrode side terminal 315D and the negative electrode side terminal 319D are disposed.

The sealing body 302 includes an O-ring groove 312. The O-ring groove 312 is formed so as to surround a region where the positive electrode side terminal 315D and the negative electrode side terminal 319D are disposed. The O-ring groove 312 is disposed in the module opening 403 of the passage forming body 400 in a state in which an O-ring is fitted into the O-ring groove 312 and consequently functions as a positioning member of the power semiconductor module 300.

The sealing body 302 is formed by using a resin based on, for example, a novolak epoxy resin, a multi-functional epoxy resin, and a biphenyl epoxy resin. In addition, by including ceramics, gel, and rubber including such as SiO2, Al2O3, AlN, and BN, a thermal expansion coefficient approaches a coefficient of a conductor. As a result, a difference between the thermal expansion coefficients of members can be reduced, and a thermal stress generated with a temperature increase in the usage environment is significantly reduced. Therefore, the life of a power semiconductor module can be extended.

Figure 3B:
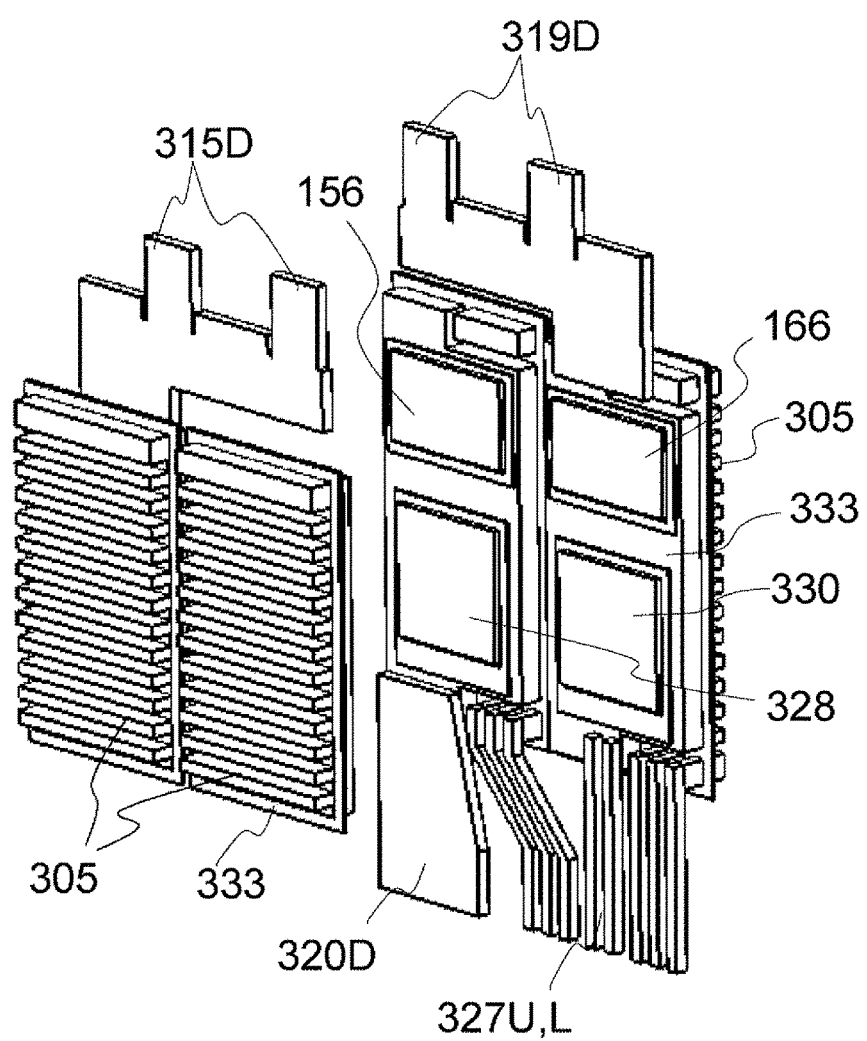
FIG. 3B is an exploded perspective view of the power semiconductor module 300.

FIG. 3(b) is an exploded perspective view indicating a process to assemble the power semiconductor module 300. In FIG. 3(b), the sealing body 302 is not illustrated. The power semiconductor module 300 includes an insulation material 333. A wiring pattern is integrally formed on the insulation material 333. The wiring pattern integrally formed on the insulation material 333 is connected to the positive electrode side terminal 315D, the negative electrode side terminal 319D, the AC terminal 320, the signal connection terminals 327U and 327L.

Further, the IGBTS 328 and 330 and the diodes 156 and 166 are connected in the wiring pattern as a semiconductor device. An electrode is formed on both surfaces of the semiconductor device. Then, the wiring pattern integrally formed on the insulation material 333 is disposed to on both surface sides of the power semiconductor device. In other words, the power semiconductor device is metal-bonded to a conductor plate forming the wiring pattern so as to be sandwiched by the conductor plate.

The fin 305 is formed on an opposite side of the power semiconductor device across the insulation material 333. The fin 305 is exposed from the sealing body 302 as described above. Heat generated from the power semiconductor device is dissipated from the fin 305 formed on a surface of the sealing body 302 via the insulation material 333.

The fin 305 includes an electrically conductive material and a thermoconductive material. For example, Cu, Cu alloy, a compound material such as Cu—C and Cu—CuO, Al, Al alloy, or a compound material such as AlSiC and Al—C can be used. For example, a metallic sintered material using, for example, a Sn alloy-based soft solder material, a hard solder material such as Al alloy/Cu alloy, and metal nanoparticles/microparticles can be used for a metal bonding agent.

Figure 3C:
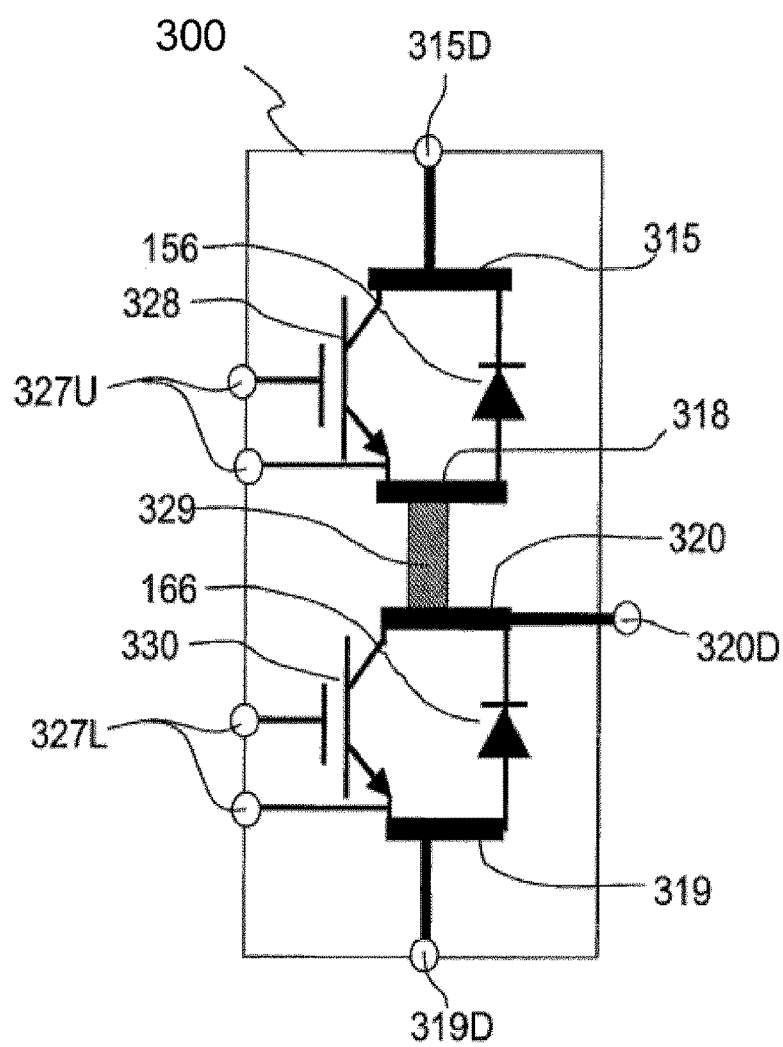
FIG. 3C is a circuit structural view of the power semiconductor module 300.

FIG. 3(c) is a circuit structural view of the power semiconductor module 300. Reference signs in the drawing correspond to signals indicated in FIGS. 3(a) and 3(b).

FIG. 4(a) is a perspective view illustrating a structure of the DC positive electrode bus bar 700 and the DC negative electrode bus bar 701. The DC positive electrode bus bar 700 and the DC negative electrode bus bar 701 are disposed so as to be laminated each other. The DC positive electrode bus bar 700 and the DC negative electrode bus bar 701 include the module opening portion 703, the capacitor opening portion 704, the module connection terminal 705, and the capacitor connection terminal 706 on a wide upper surface.

Three module opening portions 703 are formed along a longitudinal direction of a bus bar. One capacitor opening portion 704 is formed adjacent to the three module opening portions 703. The module connection terminal 705 is erected from an edge of the module opening portion 703. The capacitor connection terminal 706 erects from an edge of the capacitor opening portion 704.

The DC positive electrode bus bar 700 and the DC negative electrode bus bar 701 include the plane portion 707 and the extension portion 708. The plane portion 707 is formed on a wide upper surface on which the module opening portion 703 and the capacitor opening portion 704 are formed. The extension portion 708 bends and extends in a direction opposed to a projecting direction of the module connection terminal 705 and the capacitor connection terminal 706 from four sides of the plane portion 707. The extension portion 708 according to the embodiment has a square-cylindrical shape extending from the four sides of the plane portion 707. The plane portion 707 extends downward across a virtual plane corresponding to an upper surface of the passage forming body 400 and is formed along the passage forming body 400 in a state in which the DC positive electrode bus bar 700 and the DC negative electrode bus bar 701 are attached to the passage forming body 400.

Figure 4B:
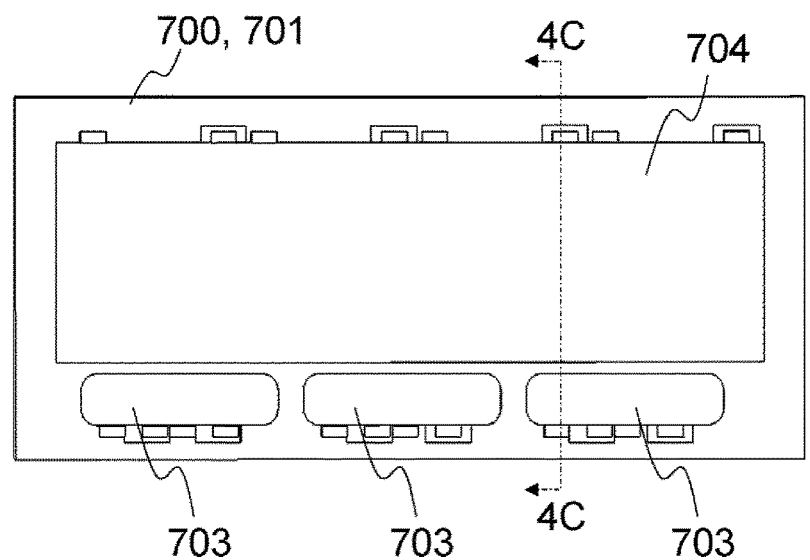
FIG. 4B is a top view illustrating a structure of a DC bus bar according to the first embodiment.
Figure 4C:
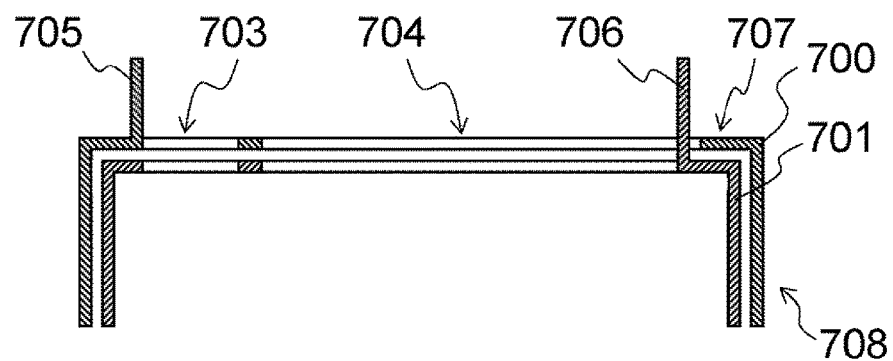
FIG. 4C is a sectional view illustrating a structure of the DC bus bar according to the first embodiment.

FIG. 4(b) is an upper surface view of the DC positive electrode bus bar 700 and the DC negative electrode bus bar 701. In addition, FIG. 4(c) is a sectional view on a sectional surface 4C illustrated in FIG. 4(b). In the DC positive electrode bus bar 700 and the DC negative electrode bus bar 701 having the above-described structure, the power semiconductor module 300 is assembled to the passage forming body 400 through the module opening portion 703, and the capacitor cell 501 is assembled to the passage forming body 400 through the capacitor opening portion 704. As a result, a case structure can be realized in which the DC positive electrode bus bar 700/the DC negative electrode bus bar 701 and the passage forming body 400 are integrated. Therefore, a complicated bus bar assembly and a heat dissipation sheet to cool a bus bar in a case are not needed, and superior assemblability is realized.

Figure 4D:
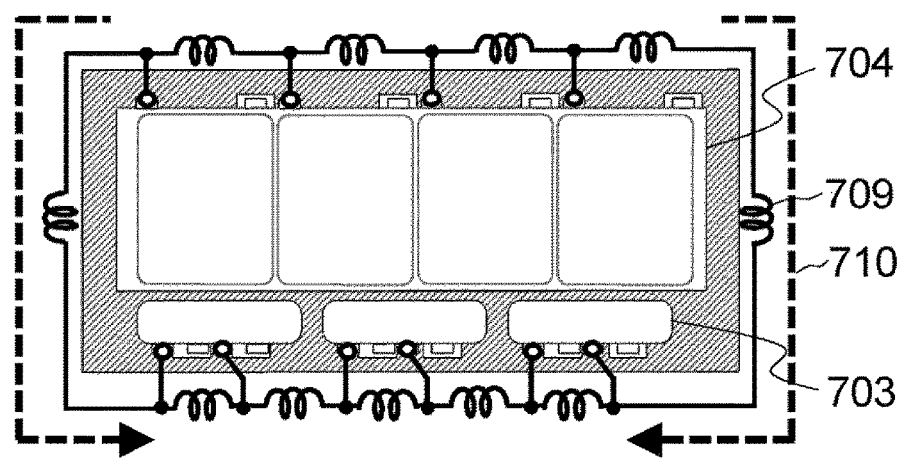
FIG. 4D is a top view describing effects of the DC bus bar according to the first embodiment.

FIG. 4(d) is an upper surface view describing an inductance reduction effect of the DC positive electrode bus bar 700 and the DC negative electrode bus bar 701. For description, hatching is applied to the DC positive electrode bus bar 700. Further, for description, wire inductance 709 of the DC positive electrode bus bar 700 is schematically illustrated. The DC positive electrode bus bar 700 and the DC negative electrode bus bar 701 form a main circuit in which the power semiconductor module 300 and the capacitor cell 501 are electrically connected. A transient current 709 is exchanged between the power semiconductor module 300 and the capacitor cell 501. Therefore, in the DC positive electrode bus bar 700 and the DC negative electrode bus bar 701, wire inductance is preferably reduced to reduce a surge voltage and a device loss.

In the DC positive electrode bus bar 700 according to the embodiment, current paths from the capacitor cell 501 to the power semiconductor module 300 are parallelly formed across the capacitor opening portion 704 and the module opening portion 703. Therefore, in a power converter in which a DC bus bar and a case are integrated, without damaging manufacturability, a parallel circuit of the wire inductance 709 is formed between the power semiconductor module 300 and the capacitor cell 501, and wire inductance can be reduced in comparison with the case where either of the current paths is disposed. Further, regarding wire inductance variation due to a position connecting to the capacitor cell 501 and the power semiconductor module 300, the variation between devices can be reduced.

Second Embodiment

Figure 5A:
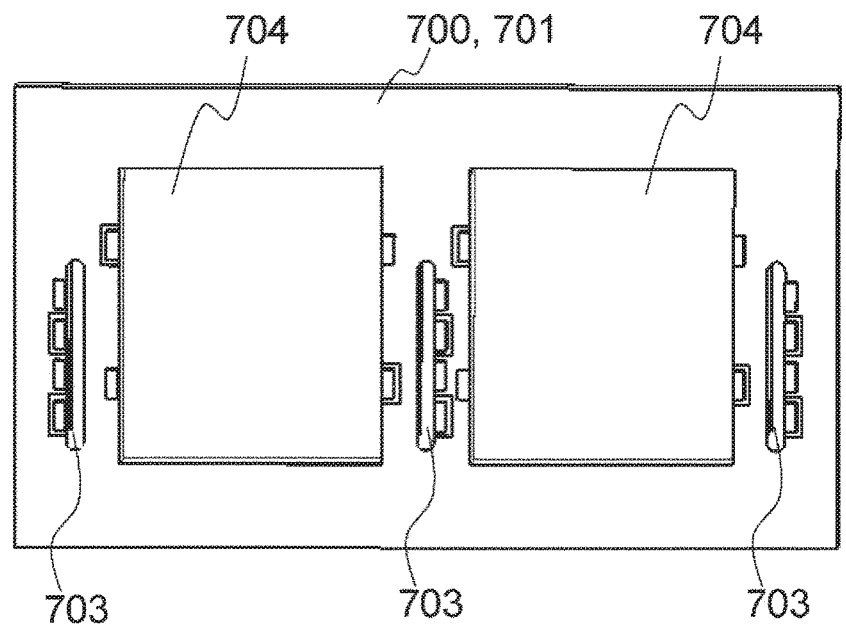
FIG. 5A is a top view illustrating a structure of a DC bus bar according to a second embodiment.

FIG. 5(a) is an upper surface view illustrating a structure of a DC positive electrode bus bar 700 and a DC negative electrode bus bar 701 according to the second embodiment. Mainly a structure of the DC positive electrode bus bar 700 and the DC negative electrode bus bar 701 in a power converter according to the embodiment is different from the structure according to the first embodiment. Therefore, only a structure of the DC positive electrode bus bar 700 and the DC negative electrode bus bar 701 is described.

In the first embodiment, three module opening portions 703 are disposed along a longitudinal direction of the DC positive electrode bus bar 700 and the DC negative electrode bus bar 701, and a capacitor opening portion 704 is formed so as to cross over the three module opening portions 703. In the second embodiment, two capacitor opening portions 704 are provided. The capacitor opening portion 704 is provided between the module opening portions 703.

Figure 5B:
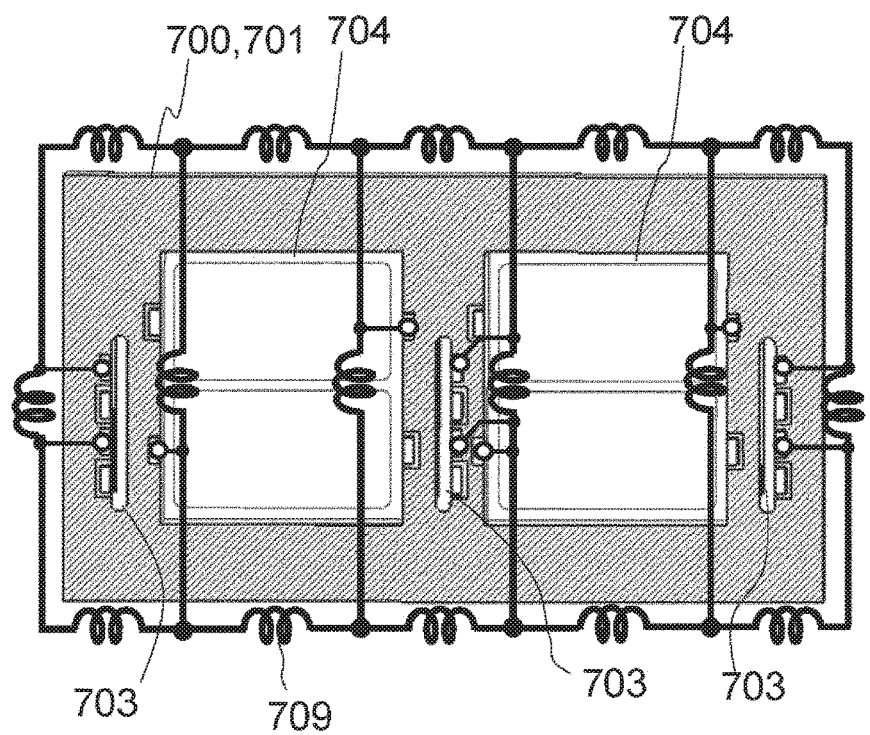
FIG. 5B is a top view describing effects of the DC bus bar according to the second embodiment.

FIG. 5(b) is an upper surface view describing an inductance reduction effect of the DC positive electrode bus bar 700 and the DC negative electrode bus bar 701. For description, hatching is applied to the DC positive electrode bus bar 700. As illustrated in FIG. 5(b), a closed circuit of a wire inductance 709 is formed by surrounding the module opening portion 703 and the capacitor opening portion 704. As a result, a parallel circuit connecting a capacitor and a power semiconductor module is formed, and wire inductance can be efficiently reduced.

Third Embodiment

Figure 6:
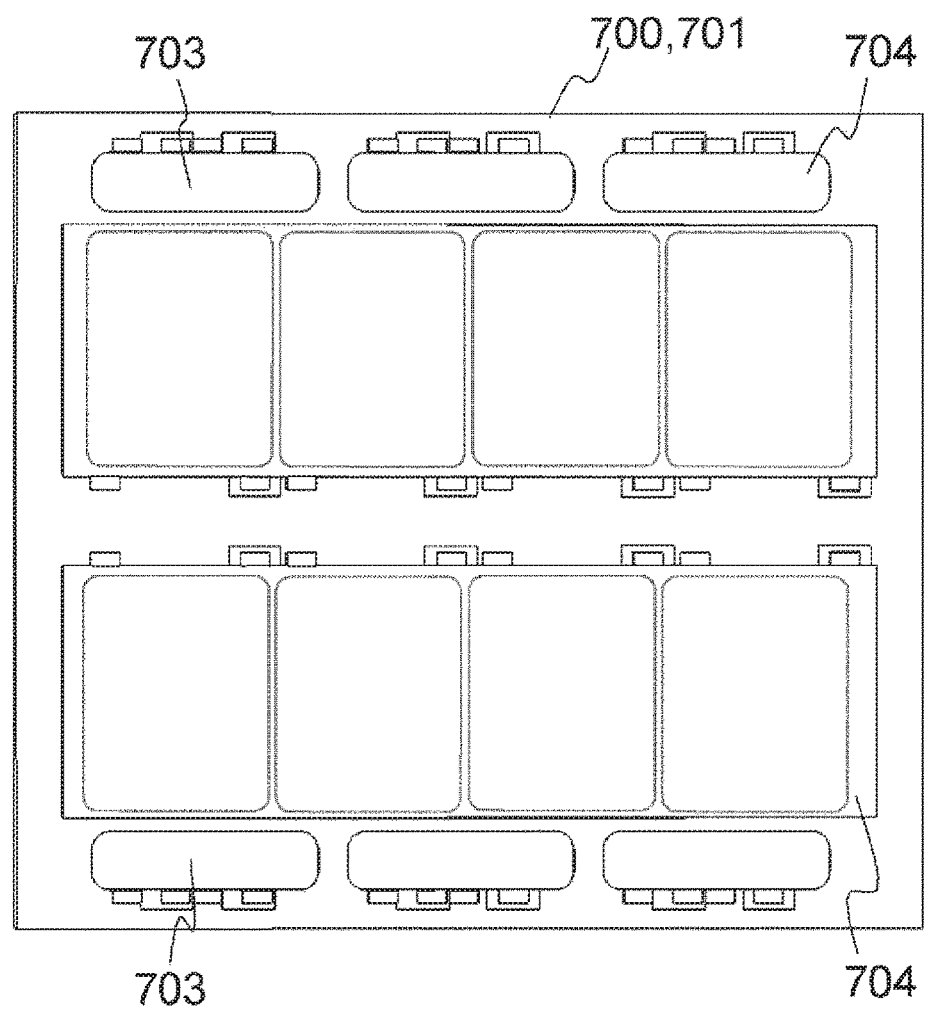
FIG. 6 is a top view illustrating a structure of a DC bus bar according to a third embodiment.

FIG. 6 is an upper surface view illustrating a structure of a DC positive electrode bus bar 700 and a DC negative electrode bus bar 701 according to a third embodiment.

The DC positive electrode bus bar 700 and the DC negative electrode bus bar 701 according to the embodiment has a structure like that the DC positive electrode bus bar 700 and the DC negative electrode bus bar 701 according to the first embodiment are vertically symmetrically connected. Such the bus bar structure is suitable in the power converter including two inverter circuits. The power converter can be miniaturized, and also a reduction effect of wire inductance by forming a parallel circuit can be obtained.

Fourth Embodiment

Figure 7:
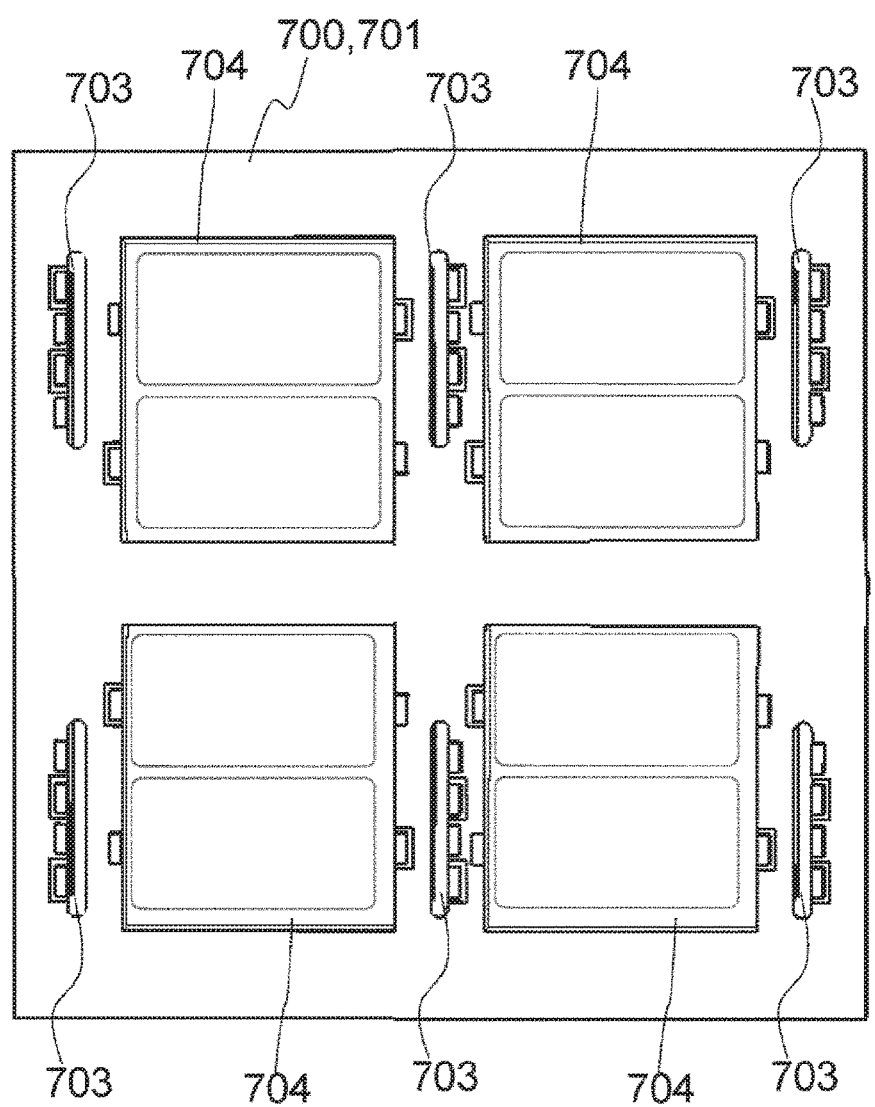
FIG. 7 is a top view illustrating a structure of a DC bus bar according to a fourth embodiment.

FIG. 7 is an upper surface view illustrating a structure of a DC positive electrode bus bar 700 and a DC negative electrode bus bar 701 according to a fourth embodiment.

The DC positive electrode bus bar 700 and the DC negative electrode bus bar 701 according to the embodiment has a structure like that the DC positive electrode bus bar 700 and the DC negative electrode bus bar 701 according to the second embodiment are vertically symmetrically connected. As with the third embodiment, such the bus bar structure is suitable in the power converter including two inverter circuits. The power converter can be miniaturized, and a reduction effect of wire inductance by forming a parallel circuit can be obtained.

REFERENCE SIGNS LIST 136 battery
138 DC connector
140 inverter
144 inverter circuit
150 series circuit
153 collector electrode (upper arm)
154 gate electrode (upper arm)
155 emitter electrode for signal (upper arm)
156 diode (upper arm)
157 positive electrode terminal (P terminal)
158 negative electrode terminal (N terminal)
159 AC terminal
163 collector electrode (lower arm)
164 gate electrode (lower arm)
165 emitter electrode for signal (lower arm)
166 diode (lower arm)
169 intermediate electrode
170 controller
172 control circuit
174 driver circuit
176 signal line
180 current sensor
182 signal line
186 AC power line (AC bus bar)
188 AC connector
192 motor generator
299 power converter
300 power semiconductor module
302 sealing body
305 fin
312O ring groove
314 DC positive electrode terminal
315D positive electrode side terminal
316 DC negative electrode terminal
319D negative electrode side terminal
320D AC terminal
327L signal connection terminal
327U signal connection terminal
328 IGBT (upper arm)
330 IGBT (lower arm)
333 insulation material
400 passage forming body
401 passage cover
402 refrigerant inlet/outlet
403 module opening
404 capacitor opening
405 module storage
406 capacitor storage
407 module second opening
410 virtual plane
411 side wall surface
500 capacitor module
501 capacitor cell
504 negative electrode side capacitor terminal
506 positive electrode side capacitor terminal
700 DC positive electrode bus bar
701 DC negative electrode bus bar
702 bus bar sealing resin
703 module opening portion
704 capacitor opening portion
705 module connection terminal
706 capacitor connection terminal
707 plane portion
708 extension portion
709 wire inductance
710 transient current
720 AC bus bar
721 bus bar sealing resin
900 case
901 case lid

The invention claimed is:

1. A power converter, comprising:
a power semiconductor module configured to convert a DC power into an AC power;

a capacitor configured to smooth the DC power;

a DC bus bar configured to transmit the DC power; and module opening portions disposed along a longitudinal direction of the DC bus bar, wherein the DC bus bar includes a first terminal which connects with the power semiconductor module and a second terminal which connects with the capacitor, the power semiconductor module is inserted into the module opening portions, and a closed circuit of a wire inductance is formed by surrounding the module opening portions and an opening in the capacitor, so as to form a parallel circuit connecting the capacitor and a power semiconductor module, thereby reducing inductance.

2. The power converter according to claim 1, comprising:

a module storage configured to store the power semiconductor module; and a case including a module opening connected to the module storage, wherein the DC bus bar is fixed to the case such that the opening portion of the DC bus bar is connected to the module storage via the module opening portions of the case.

3. The power converter according to claim 2, wherein the DC bus bar is sealed by an insulation member, and the case is integrally formed with the insulation member which seals the DC bus bar.

4. The power converter according to claim 2, wherein the DC bus bar is bent so as to across a virtual plane corresponding to a surface of the case on which the module opening portions are formed.

5. The power converter according to claim 2, comprising an AC bus bar configured to transmit the AC power, wherein the AC bus bar is disposed, across the case, on a side opposite to a side where the DC bus bar is disposed.

6. The power converter according to claim 5, wherein the AC bus bar is sealed by an insulation member, and the case is integrally formed with the insulation member which seals the AC bus bar.

7. The power converter according to claim 1, wherein the DC bus bar includes a capacitor opening portion configured to insert the capacitor, and the capacitor opening portion is connected to the module opening portions.

8. The power converter according to claim 1, wherein a positive electrode bus bar and a negative electrode bus bar are laminated in the DC bus bar.

* * * * *